United States Patent
Pnini-Mittler

(10) Patent No.: US 10,215,953 B2
(45) Date of Patent: Feb. 26, 2019

(54) TILTING AN OPTICAL ELEMENT

(71) Applicant: Carl Zeiss SMT GmbH, Oberkochen (DE)

(72) Inventor: Boaz Pnini-Mittler, Goeggingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/414,193

(22) Filed: Jan. 24, 2017

(65) Prior Publication Data

US 2017/0131518 A1 May 11, 2017

Related U.S. Application Data

(63) Continuation of application No. PCT/EP2015/067266, filed on Jul. 28, 2015.

(30) Foreign Application Priority Data

Aug. 5, 2014 (DE) .................. 10 2014 215 452

(51) Int. Cl.
*G02B 7/182* (2006.01)
*G02B 26/08* (2006.01)
(Continued)

(52) U.S. Cl.
CPC ............. *G02B 7/1827* (2013.01); *G02B 5/09* (2013.01); *G02B 7/1822* (2013.01);
(Continued)

(58) Field of Classification Search
CPC ............. G03F 7/70191; G03F 7/70816; G03F 7/70833; G03F 7/70975
(Continued)

(56) References Cited

U.S. PATENT DOCUMENTS 9,766,549 B2 * 9/2017 Kwan ................. G03F 7/70141
2010/0214675 A1 * 8/2010 Kugler .................. G02B 7/021
359/811
2014/0022658 A1 1/2014 Ziegler et al.

FOREIGN PATENT DOCUMENTS

DE 102 05 425 A1 5/2003
DE 10 2008 009 600 A1 8/2009
(Continued)

OTHER PUBLICATIONS

International Preliminary Report on Patentability for corresponding PCT Appl No. PCT/EP2015/067266, dated Feb. 16, 2017.
(Continued)

*Primary Examiner* — Hung Nguyen
(74) *Attorney, Agent, or Firm* — Fish & Richardson P.C.

(57) ABSTRACT

An optical unit, in particular a facet mirror unit, includes an optical element and a supporting device. The optical element has an optical surface, in particular an elongate optical surface, which defines a plane of main extension and a direction of main extension in the plane of main extension. The supporting device includes a supporting unit and an actuator unit. The actuator unit is configured for tilting the optical surface, in that a tilting moment is exerted on the optical element by way of the actuator unit. The tilting moment runs in an inclined manner in relation to the plane of main extension. The supporting unit is configured to predefine a tilting axis for the optical surface that lies substantially in the plane of main extension of the optical surface when there is tilting of the optical surface by the tilting moment of the actuator unit.

28 Claims, 4 Drawing Sheets

(51) Int. Cl.
*G03F 7/20* (2006.01)
*G02B 5/09* (2006.01)

(52) U.S. Cl.
CPC ..... *G02B 26/0816* (2013.01); *G03F 7/70075* (2013.01); *G03F 7/70116* (2013.01); *G03F 7/70191* (2013.01)

(58) Field of Classification Search
USPC .............................. 355/53, 67; 359/818–820
See application file for complete search history.

(56) References Cited

FOREIGN PATENT DOCUMENTS

DE    10 2012 223 034 A1    12/2013
EP          1 923 985 A1     5/2008

OTHER PUBLICATIONS

International Search Report for corresponding PCT Appl No. PCT/EP2015/067266, dated Nov. 2, 2015.
Chinese Office Action and Search Report, with translation thereof, for corresponding CN Appl No. 201580042004.9, dated Nov. 13, 2018.

\* cited by examiner

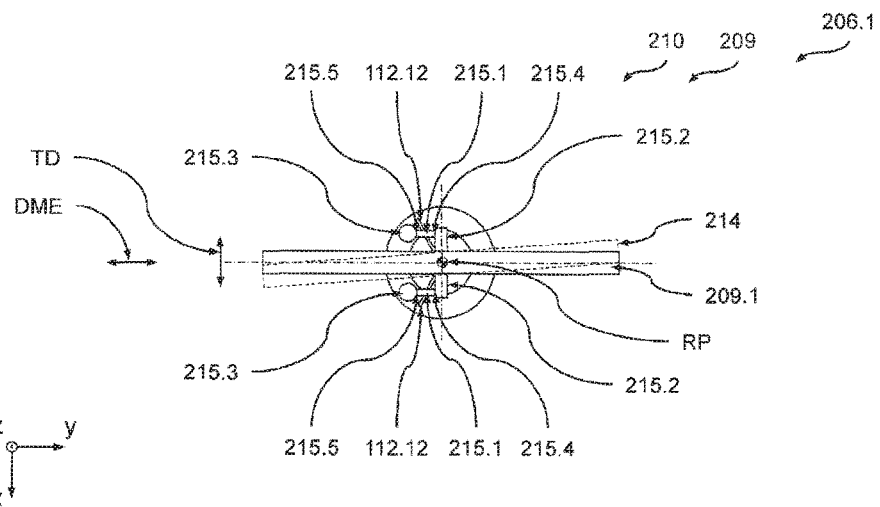
Fig. 7
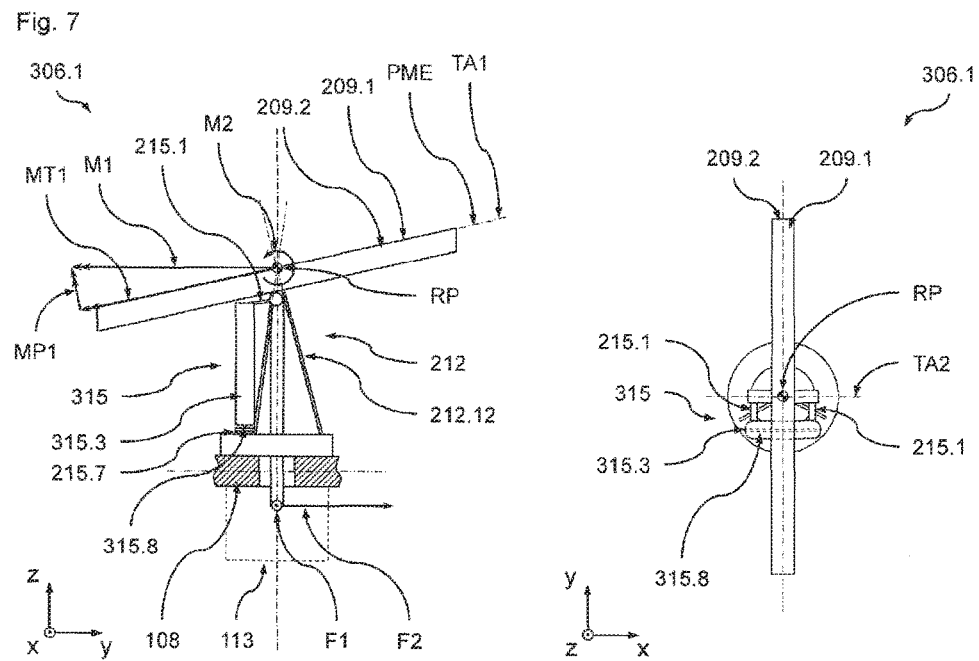
Fig. 8                                Fig. 9

TILTING AN OPTICAL ELEMENT

CROSS REFERENCE TO RELATED APPLICATIONS

The present application is a continuation of, and claims benefit under 35 USC 120 to, international application PCT/EP2015/067266, filed Jul. 28, 2015, which claims benefit under 35 USC 119 of German Application No. 10 2014 215 452.9, filed Aug. 5, 2014. The entire disclosure of international application PCT/EP2015/067266 and German Application No. 10 2014 215 452.9 are incorporated by reference herein.

FIELD

The present disclosure relates to an optical unit and to a method for supporting an optical element. The disclosure can be applied in conjunction with any desired optical devices or optical imaging methods. In particular, it can be used in conjunction with the microlithography that is used in the production of microelectronic circuits or of measuring systems for such microlithographic systems.

BACKGROUND

In particular in the area of microlithography, apart from the use of components that are configured with the highest possible precision, among the desired properties are to set the position and geometry of optical modules of the imaging device, that is to say for example the modules with optical elements such as lenses, mirrors or gratings, but also the masks and substrates that are used, as precisely as possible according to predefined setpoint values during operation, or to stabilize such components in a predefined position or geometry in order to achieve a correspondingly high imaging quality.

In the area of microlithography, the accuracy requirements are in the microscopic range of the order of a few nanometers or below. They are in this case not least a consequence of the constant demand to increase the resolution of the optical systems that are used in the production of microelectronic circuits in order to advance the miniaturization of the microelectronic circuits to be produced.

With the increased resolution, and the generally accompanying reduction in the wavelength of the light used, the requirements for the accuracy of the positioning and orientation of the components used naturally increase. In particular for the low operating wavelengths that are used in microlithography in the UV range (for example in the range of 193 nm), but in particular in the so-called extreme UV range (EUV), with operating wavelengths between 5 nm and 20 nm (typically in the range of 13 nm), this of course has an effect on the effort that has to be expended to maintain the high requirements for the accuracy of the positioning and/or orientation of the components involved.

In particular in conjunction with the aforementioned EUV systems, refined influencing of the intensity distribution of the light that is used for the imaging is gaining ever increasing importance. For this purpose, generally so-called facet mirrors are used, in which a multiplicity of extremely small facet elements with an exactly defined position and/or orientation of their optically effective surface with respect to a predefinable reference are arranged in a grid that is as closely spaced as possible. It is in this respect often desired or required (e.g. for a change of the illumination setting) to change the alignment of the facet elements, consequently therefore to tilt their optical surface.

It is known from DE 102 05 425 A1 (Holderer et al.) and DE 10 2008 009 600 A1 (Dinger), the respective disclosure of which is incorporated herein by reference, in conjunction with the defined positioning and orientation of the facet elements of a facet mirror of an EUV system to adjust these facet elements individually. For this purpose, the facet elements are tilted about a tilting axis defined by the supporting structure via a corresponding tilting moment, which is exerted on the facet element by an assigned actuator unit.

In the case of some of the rotationally symmetric facet elements that are known from DE 102 05 425 A1, the tilting axis lies in the plane of main extension of the optical surface, with the tilting moment that is exerted by the actuator unit running parallel to the plane of main extension of the optical surface, and so the optical surface is just tilted, without the facet element undergoing any lateral displacement from the installation space that is provided for the facet element.

Because of the absence of lateral displacement during the tilting, the known facet elements can in principle be positioned particularly close to one another, and therefore do not require large gaps between the facet elements. It is problematic here however that the rotationally symmetric design itself causes comparatively low utilization of the surface area or comparatively large gaps between the facet elements, in which there may be a comparatively great loss of light.

To avoid such losses of light due to gaps between facet elements, or as a result of certain illumination settings, often elongate, non-rotationally symmetric facet elements, which in principle lie against one another almost without any gap in a certain alignment or in a certain switching state, are used. Such a configuration is known for example from DE 10 2008 009 600 A1, providing a cardanic support for the facet elements that has two orthogonal tilting axes which run parallel to the plane of the supporting structure of the facet elements.

A similar support for such elongate, non-rotationally symmetric facet elements is also known from DE 10 2012 223 034 A1 (Latzel et al.), the disclosure of which is incorporated herein by reference. There, the supporting of the respective facet element on a supporting structure is realized by way of a three-rod support in the manner of a ball joint, the optical surfaces of the facet elements running parallel to the plane of the supporting structure. The ball-joint-like support in this case defines an infinite number of tilting axes for the respective facet element, and so the actual tilting axis must then be predefined by the actuating mechanism. Here, too, the actuating mechanism again acts parallel to the plane of the supporting structure of the facet elements, and so the tilting moment that is exerted on the facet element lies in the optical surface. Therefore, here, too, the actuating mechanism consequently again provides tilting axes that run parallel to the plane of the supporting structure of the facet elements.

Certain settings require however that the planes of main extension of the optical surfaces of some (possibly even all) of the facet elements run in an inclined manner in relation to the plane of main extension of the base element of their supporting structure. Not least as a result of the existing restrictions with respect to installation space, this often means that the tilting moment produced by the actuating mechanism (in the region of the base element of its supporting structure) runs in an inclined manner in relation to the plane of main extension of the optical surface.

This inclination of the tilting moment in relation to the plane of main extension has the disadvantage that, apart from the desired component (producing the tilting of the optical surface) parallel to the plane of main extension, the tilting moment also has a parasitic component perpendicular to the plane of main extension, which brings with it an undesired rotation of the optical surface in the plane of main extension. Especially in the case of long, slender facet elements, this rotation of the optical surface in the plane of main extension leads to a greater or lesser degree of lateral displacement of the free ends of the facet elements, for which it is desirable to provide corresponding clearances between the facet elements that are undesired (from the aspect of the least possible loss of light).

SUMMARY

The present disclosure is therefore based on the object of providing an optical unit and a method for supporting an optical element that do not have the aforementioned disadvantages, or at least to a lesser extent, and in particular ensure a particularly high utilization of the surface area or a particularly dense packing of the facet elements in an easy way in spite of the possibility of a tilting of the optical surfaces.

The present disclosure is based on the concept that, in spite of the possibility of tilting, a particularly high utilization of the surface area or a particularly dense packing of the facet elements can be achieved in an easy way if the supporting unit is configured to predefine a tilting axis for the optical surface that lies substantially in the plane of main extension of the optical surface when there is tilting of the optical surface by the tilting moment of the actuator unit.

It has been found that, even under the adverse conditions described with regard to the alignment of the tilting moment, it is possible without elaborate modification of the actuating mechanism (as would be required in the case of conventional designs, for example in the case of the design from DE 10 2012 223 034 A1) to predefine a tilting axis for the optical surface that lies substantially in the plane of main extension of the optical surface by simple, purely passive measures in the region of the supporting device, and so even under these circumstances it is possible to prevent lateral displacement of parts of the optical element when there is tilting of the optical surface. It is accordingly also possible hereby to realize a particularly dense packing of the optical elements with little loss of light in spite of the active adjustability (e.g. when changing the illumination setting).

According to a first aspect, the present disclosure therefore relates to an optical unit, in particular a facet mirror unit, including an optical element and a supporting device, wherein the optical element has an optical surface, in particular an elongate optical surface, which defines a plane of main extension and a direction of main extension in the plane of main extension, the supporting device including a supporting unit and an actuator unit. The actuator unit is configured for tilting the optical surface, in that a tilting moment is exerted on the optical element by way of the actuator unit, the tilting moment running in an inclined manner in relation to the plane of main extension. The supporting unit is configured to predefine a tilting axis for the optical surface that lies substantially in the plane of main extension of the optical surface when there is tilting of the optical surface by the tilting moment of the actuator unit.

The tilting axis may in principle be oriented in almost any desired way within the plane of main extension. A particularly dense packing or close-together arrangement of the optical elements is however possible if the supporting element is designed in such a way that the tilting axis for the optical surface runs substantially parallel, in particular substantially collinear, to the direction of main extension.

The present disclosure can in principle be used in the case of any desired setups with any desired inclination of the tilting moment in relation to the plane of main extension. Particularly favorable results can be achieved if the tilting moment is inclined by 1° to 30°, preferably 5° to 20°, more preferably 8° to 15°, in relation to the plane of main extension and/or the direction of main extension of the optical surface. In these cases, the tilting moment inclined in relation to the plane of main extension or the parasitic component thereof that is perpendicular to the plane of main extension (which brings about the parasitic lateral rotation movement) can be effectively compensated by a particularly simple passive mechanism.

The tilting axis may in principle run at a certain distance from the optical surface. Particularly favorable kinematic conditions can be obtained, however, if the tilting axis for the optical surface lies substantially on the optical surface at at least one tilting axis point. It is particularly preferred in this respect if the tilting axis for the optical surface lies in the tangential plane of the optical surface that is defined at the tilting axis point.

In principle, active or semi-active components may be used to compensate for the parasitic component of the tilting moment that is perpendicular to the plane of main extension. In the case of particularly advantageous variants of the disclosure, the supporting unit is designed as a passive device, which defines the tilting axis by way of passive elements.

The supporting unit may in principle be designed in any desired suitable way to support the optical element. It is preferred that the supporting unit includes at least two supporting elements, in particular at least three supporting elements, and a base element, at least a large part of the weight of the optical element being introduced into the base element by way of the supporting elements in at least one operating state, in particular at least 80%, preferably at least 90%, more preferably 95% to 100%, of the weight of the optical element being introduced into the base element. This makes it possible to achieve designs of a particularly simple construction that also allow easy integration of the passive compensation of the parasitic component of the tilting moment.

In the case of variants of the disclosure of a particularly simple design, the supporting unit includes at least two at least partly elastically deformable supporting elements, which define the tilting axis. In this respect it is possible to use for example an element designed in the manner of a leaf spring or the like, which forms the corresponding elastically deformable portion.

Furthermore, the supporting unit may include at least one guiding unit, which is connected to the optical element and, for the definition of the tilting axis, restricts at least two degrees of freedom of movement, in particular three degrees of freedom of movement, of the optical element.

Here it is preferred in particular that the rotational degree of freedom perpendicularly to the plane of main extension of the optical surface is restricted to achieve the compensation for the parasitic component of the tilting moment. The supporting unit therefore preferably includes at least one guiding unit, which is connected to the optical element and for the definition of the tilting axis is designed in such a way that it takes up a component of the tilting moment acting perpendicularly to the plane of main extension of the optical surface.

In the case of variants of the disclosure of a particularly simple design, the supporting unit includes at least two elastically deformable supporting elements designed in the manner of a leaf spring, which define the tilting axis. Each of the supporting elements in this case preferably defines a leaf spring plane of main extension, the supporting elements being arranged in an inclined manner in relation to one another in such a way that the leaf spring planes of main extension intersect in the tilting axis. The desired orientation of the parasitic component of the tilting moment or the desired compensation for it can thereby be achieved in a particularly easy way.

The geometry of the supporting elements may in principle be chosen in any desired suitable way to define the tilting axis in the desired position. At least one of the supporting elements is preferably designed as a leaf spring that is configured to be substantially planar in a state in which it is only subjected to the loading of the weight of the optical element. This results in robust configurations that can be produced particularly easily.

Variants that are advantageous under dynamic aspects are obtained if at least one of the supporting elements is designed as a thin leaf spring with a length dimension along a longitudinal axis and a maximum thickness dimension perpendicular to a leaf spring plane of main extension, the maximum thickness dimension being in particular less than 4%, preferably less than 2%, more preferably 0.2% to 1%, of the length dimension.

The leaf spring elements may in principle have any desired outer contour, as long as their leaf spring planes of main extension intersect in the tilting axis. Robust configurations that can be produced particularly easily are obtained if each of the supporting elements defines a leaf spring plane of main extension and at least one of the supporting elements, in its leaf spring plane of main extension, has a substantially parallelogram-shaped outer contour, at least one pair of sides of the outer contour running substantially parallel to the tilting axis.

In the case of further variants of the disclosure that are preferred, because they can be easily realized, the supporting unit includes at least three elastically deformable supporting elements designed in the manner of an elastic strut, which define the tilting axis. For this purpose, elastic struts of a simple design in the manner of a rod spring may be used for example. In principle, the arrangement of the elastic struts may in this case be chosen in any desired way, it being preferred that the supporting elements are arranged in the manner of a tripod.

In the case of preferred variants of the disclosure, each of the supporting elements defines a strut longitudinal axis, the supporting elements being arranged in an inclined manner in relation to one another in such a way that the strut longitudinal axes intersect at a tilting axis point. This ultimately allows an attachment of the optical element that is designed in the manner of a ball joint to be realized. This can be supplemented in a particularly easy way by a corresponding guiding unit, by way of which the desired orientation of the tilting axis or the desired compensation for the parasitic component of the tilting moment can be achieved.

It is preferred that the supporting elements define in each case a strut longitudinal axis, wherein they have substantially the same length dimension along their strut longitudinal axis. This results in designs that can be realized particularly easily.

The elastic struts may in turn be designed in principle in any desired way, in particular have any desired, partly curved and/or partly polygonal shape. At least one of the supporting elements is preferably designed as a rod spring, which is configured to be substantially straight in a state in which it is only subjected to the loading of the weight of the optical element.

At least one of the supporting elements is preferably designed as a slender rod spring with a length dimension along a longitudinal axis and a maximum transverse dimension perpendicular to the longitudinal axis, the maximum transverse dimension being in particular less than 4%, preferably less than 2%, more preferably 0.3% to 1.8%, of the length dimension. This allows designs to be achieved which are particularly advantageous under dynamic aspects.

The desired orientation of the tilting axis may be defined in any desired way. It is preferred that the supporting unit includes a base element and at least one guiding element for the definition of the tilting axis, the supporting elements being supported on the base element and the guiding unit being arranged kinematically parallel to the supporting elements between the base element and the optical element.

It is preferred that the guiding unit restricts at least two degrees of freedom of movement, in particular three degrees of freedom of movement, of the optical element in order to achieve the desired compensation for the parasitic component of the tilting moment. The rotational degree of freedom perpendicularly to the plane of main extension of the optical surface is of course preferably restricted here to compensate for the corresponding parasitic component of the tilting moment. It is therefore preferred that the guiding unit is designed in particular in such a way that it takes up a component of the tilting moment acting perpendicularly to the plane of main extension of the optical surface.

It is also possible to only partly compensate the parasitic component of the tilting moment acting perpendicularly to the plane of main extension of the optical surface. It is preferred that the guiding unit is designed in such a way that, when there is tilting of the optical surface by the tilting moment, an opposing moment is exerted on the optical element, the opposing moment compensating for at least part, in particular at least 75%, preferably at least 85%, more preferably 90% to 100%, of a component of the tilting moment acting perpendicularly to the plane of main extension of the optical surface.

The guiding unit may in principle be designed in any desired way, as long as the desired at least partial compensation for the parasitic component of the tilting moment is achieved. In the case of advantageous variants of the disclosure, the guiding unit has at least one guiding element that is connected in an articulated manner to the optical element and the base element and brings about the at least partial compensation for the parasitic component of the tilting moment.

In the case of variants of the disclosure that are particularly robust and nevertheless simply designed, the guiding unit has at least two guiding elements connected in an articulated manner to the optical element and the base element, the guiding elements being arranged in particular, in a transverse direction of the optical element, on opposite sides of the optical element, the transverse direction lying in the plane of main extension and running perpendicularly to the direction of main extension.

The guiding unit may in principle be designed in any desired way to achieve the compensation for the parasitic component of the tilting moment. Thus, one or more simple rod elements or the like may be used to introduce the desired opposing moment into the optical element. In the case of simple and robust variants, the guiding unit has at least one guiding element designed in the manner of a leaf spring.

The connection between the optical element and the base element may in principle be designed in any desired way to achieve the compensation for the parasitic component of the tilting moment. It is preferred that at least one guiding element defines a first point of articulation on the optical element and a second point of articulation on the base element, a connecting line between the first point of articulation and the second point of articulation, in a plane running perpendicularly to the plane of main extension and parallel to the tilting moment, running in an inclined manner in relation to the tilting moment by a first angle of inclination, the first angle of inclination being in particular 1° to 30°, preferably 5° to 20°, more preferably 8° to 15°. In addition or alternatively, a connecting line between the first point of articulation and the second point of articulation, in a plane running perpendicularly to the plane of main extension and parallel to the tilting moment, may run in an inclined manner in relation to the plane of main extension by a second angle of inclination, the second angle of inclination being in particular −10° to 10°, preferably −5° to 5°, more preferably 0° to 2°. This allows at least partial compensation for the parasitic component of the tilting moment to be achieved in each case in a particularly easy way. It is preferred that the connecting line in this case is inclined with respect to the tilting moment in the same sense of rotation as the plane of main extension.

In the case of particularly favorably designed variants with easy and effective compensation for the parasitic component of the tilting moment, the supporting elements define a point of rotation, which lies in particular in the plane of main extension, while the first point of articulation, in particular in the transverse direction of the optical element, is at a distance from the point of rotation by a point-of-rotation distance. A point-of-articulation distance between the first point of articulation and the second point of articulation and/or the point-of-rotation distance and/or the first angle of inclination and/or the second angle of inclination is then chosen here in such a way that, when there is tilting of the optical surface by the tilting moment of the actuator unit, a tilting axis that lies substantially in the plane of main extension of the optical surface is predefined for the optical surface.

It goes without saying that, depending on the requirement of the imaging to be achieved or depending on the number and/or type of settings to be achieved, the tilting axis described above may be the only tilting axis that is predefined for the optical surface. Accordingly, the tilting moment may be the only tilting moment that is predefined or produced during operation.

In the case of preferred variants of the disclosure, however, a number of tilting motions of the optical element about a number of tilting axes are provided. Accordingly, in these cases the tilting axis described above is a first tilting axis of the optical surface, while the associated tilting moment is a first tilting moment. In these cases, the supporting unit is configured for the purpose of defining a second tilting axis of the optical surface, running transversely, in particular perpendicularly, to the first tilting axis, under the effect of a second tilting moment running transversely, in particular perpendicularly, to the first tilting moment. It is preferred that the second tilting axis here again lies substantially in the plane of main extension of the optical surface.

In principle, the same measures may be used for the second tilting axis or for the definition thereof as for the (first) tilting axis described above. Therefore, also in this connection it is preferred that the supporting unit is designed as a passive device, which defines the second tilting axis by way of passive elements. The supporting unit may in turn include at least one guiding unit, which is connected to the optical element and for the definition of the second tilting axis restricts at least two degrees of freedom of movement, in particular three degrees of freedom of movement, of the optical element.

The supporting unit preferably includes at least two at least partly elastically deformable supporting elements, which define the second tilting axis, these preferably being in turn supporting elements designed in the manner of a leaf spring. In particular, the supporting unit may include at least two elastically deformable supporting elements designed in the manner of a leaf spring, in particular as a thin leaf spring, which define the second tilting axis. It may be provided here that each of the supporting elements defines a leaf spring plane of main extension and the supporting elements are arranged in an inclined manner in relation to one another in such a way that the leaf spring planes of main extension intersect in the second tilting axis: furthermore, it may in turn be provided that at least one of the supporting elements has in its leaf spring plane of main extension a substantially parallelogram-shaped outer contour, at least one pair of sides of the outer contour running substantially parallel to the second tilting axis.

The present disclosure may in principle be used for all configurations in which the tilting moment of the actuating mechanism produces a parasitic component that produces an undesired lateral rotation of the optical element in the plane of main extension of the optical surface when there is tilting of the optical surface.

The advantages take effect particularly well in conjunction with slender or elongate optical elements, since, because of the great distance (that there is in such cases) from the free ends of the optical element to the tilting axis, such a parasitic lateral rotation leads to comparatively great parasitic deflections at these free ends. It would otherwise be necessary to provide, for these parasitic deflections, corresponding interspaces between the optical elements, which are accompanied by correspondingly great loss of light.

In the case of particularly advantageous variants of the use of the disclosure, the optical surface is therefore designed so as to be elongate in the direction of main extension and/or slender transversely to the direction of main extension. Particularly favorable setups are obtained in cases in which the optical surface has a first maximum dimension in the direction of main extension and a second maximum dimension perpendicularly to the direction of main extension, the second maximum dimension being less than 10%, preferably less than 5%, more preferably 0.2% to 2%, more preferably 0.5% to 1%, of the first maximum dimension.

The actuator unit may in principle be designed in any suitable desired way and possibly include any desired suitable actuators that produce the tilting moment concerned. In the case of variants that are preferred because they are particularly simply designed, the actuator unit is configured for exclusively exerting, in one operating state, on the optical element the tilting moment that runs in an inclined manner in relation to the plane of main extension. In addition or alternatively, the actuator unit may be configured for exclusively exerting, in one operating state, on the optical element a tilting moment that runs transversely, in particular perpendicularly, to the tilting moment which runs in an inclined manner in relation to the plane of main extension.

The present disclosure also relates to an optical module, in particular a facet mirror, with at least one optical unit according to the disclosure. This makes it possible to realize the variants and advantages described above in connection with the optical unit according to the disclosure to the same extent, and so reference is made to the explanations given above in this respect.

In the case of the optical module according to the disclosure, the optical units may in principle be designed as separate units that are connected to one another in a suitable way. In the case of preferred variants, however, components that share a number of optical units are provided. It may thus be provided that the supporting units of a number of optical units have a common base element.

In principle, any desired (reflective and/or refractive and/or diffractive) optical elements come into consideration for the optical element. It is preferred that the optical element is a facet element with an optically effective surface, the optically effective surface having in particular a surface area of 0.1 mm$^2$ to 200 mm$^2$, preferably 0.5 mm$^2$ to 100 mm$^2$, more preferably 1.0 mm$^2$ to 50 mm$^2$.

The optical module may in principle include any desired number of optical elements. It is preferred that 100 to 100000, preferably 100 to 10000, more preferably 1000 to 10000, facet elements are provided. In the case of further variants of the disclosure, 50 to 10000, preferably 100 to 7500, more preferably 500 to 5000, facet elements may be provided.

The present disclosure also relates to an optical imaging device, in particular for microlithography, including an illumination device (102) with a first optical element group, an object device for receiving an object, a projection device with a second optical element group and an image device, the illumination device being configured for illuminating the object and the projection device being configured for projecting an image of the object onto the image device. The illumination device and/or the projection device includes an optical module according to the disclosure or at least one optical unit according to the disclosure, respectively. This also makes it possible to realize the variants and advantages described above in connection with the optical unit according to the disclosure to the same extent, and so reference is made to the explanations given above in this respect.

According to a further aspect, the present disclosure relates to a method for supporting an optical element, in particular a facet element of a facet mirror, via a supporting device, the optical element having an optical surface, in particular an elongate optical surface, which defines a plane of main extension and a direction of main extension in the plane of main extension. In this method, the optical element is tilted, in that a tilting moment is exerted on the optical element. The tilting moment in this case runs in an inclined manner in relation to the plane of main extension, while the supporting unit predefines a tilting axis for the optical surface that lies substantially in the plane of main extension of the optical surface when there is tilting of the optical surface by the tilting moment. This also makes it possible to realize the variants and advantages described above in connection with the optical unit according to the disclosure to the same extent, and so reference is made to the explanations given above in this respect.

It is preferred that the supporting unit predefines a tilting axis for the optical surface that runs substantially parallel, in particular substantially collinear, to the direction of main extension. It is also preferred for the definition of the tilting axis that at least two degrees of freedom of movement, in particular three degrees of freedom of movement, of the optical element are restricted.

For the definition of the tilting axis, a component of the tilting moment that acts perpendicularly to the plane of main extension of the optical surface is preferably taken up by at least one guiding unit of the supporting unit. In the case of advantageous variants, the guiding unit exerts an opposing moment on the optical element when there is tilting of the optical surface, the opposing moment compensating for at least part, in particular at least 75%, preferably at least 85%, more preferably 90% to 100%, of a component of the tilting moment acting perpendicularly to the plane of main extension of the optical surface.

Preferably, here too the tilting axis is a first tilting axis of the optical surface and the tilting moment is a first tilting moment, the supporting unit then defining, under the effect of a second tilting moment running transversely, in particular perpendicularly, to the first tilting moment, a second tilting axis of the optical surface, running transversely, in particular perpendicularly, to the first tilting axis. Here too it is preferred that the second tilting axis again lies substantially in the plane of main extension of the optical surface. Once again it is preferred that, in one operating state, exclusively the tilting moment running in an inclined manner in relation to the plane of main extension is exerted on the optical element. In addition or alternatively, in one operating state, exclusively a tilting moment that runs transversely, in particular perpendicularly, to the tilting moment running in an inclined manner in relation to the plane of main extension may be exerted on the optical element.

Finally, the present disclosure relates to an optical imaging method, in particular for microlithography, in which an object is illuminated by way of an illumination device with a first optical element group and an image of the object is produced on an image device via a projection device with a second optical element group, a method according to the disclosure being used for supporting an optical element in the illumination device and/or the projection device. This also makes it possible to realize the variants and advantages described above in connection with the optical unit according to the disclosure to the same extent, and so reference is made to the explanations given above in this respect.

Further preferred embodiments of the disclosure become apparent from the dependent claims and the following description of preferred exemplary embodiments, which refers to the attached drawings. Here, any combinations of the disclosed features are part of the subject matter of the disclosure, regardless of the mentioning thereof in the claims.

BRIEF DESCRIPTION OF THE DRAWINGS

FIG. 7 is a schematic plan view of the optical unit from FIG. 5.

FIG. 8 is a schematic side view of a further preferred variant of the optical unit according to the disclosure.

FIG. 9 is a schematic plan view of the optical unit from FIG. 8.

DETAILED DESCRIPTION OF THE DISCLOSURE

First Embodiment

A first embodiment of an optical imaging device 101 according to the disclosure is described below with reference to FIGS. 1 to 4. In order to simplify the understanding of the following explanations, an orthogonal xyz-coordinate system was introduced into the attached drawings, in which the z-direction coincides with the direction of the gravitational force. However, it goes without saying that any other desired alignment of this xyz-coordinate system or of the components of the optical imaging device in space can also be selected in other variants of the disclosure.

Figure 1:
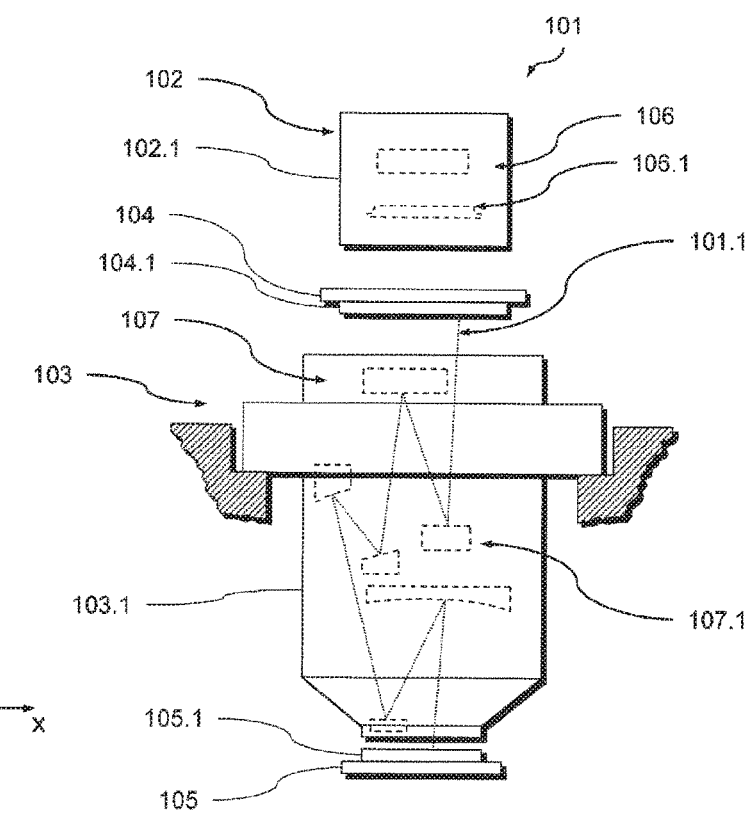
FIG. 1 is a schematic illustration of a preferred embodiment of an optical imaging device according to the disclosure, which includes a preferred embodiment of an optical module according to the disclosure with a preferred embodiment of an optical unit according to the disclosure, in which a preferred embodiment of a method according to the disclosure is used for supporting an optical element.

FIG. 1 is a schematic illustration, not to scale, of the optical imaging device in the form of a microlithographic device 101, which is used for producing microelectronic circuits. The imaging device 101 includes an illumination device 102 and an optical projection device 103, which is configured for projecting an image of a projection pattern formed on a mask 4.1 of a mask device 104 onto a substrate 105.1 of a substrate device 105 in an imaging process. For this purpose, the illumination device 102 illuminates the mask 104.1 with an illumination light beam (not illustrated any more specifically). The projection device 103 then receives the projection light beam coming from the mask 104.1 (which in FIG. 1 is indicated by the line 101.1) and projects the image of the projection pattern of the mask 104.1 onto the substrate 105.1, for example onto a so-called wafer or the like.

The illumination device 102 includes a system of optical elements 106 (only illustrated in a highly schematized form in FIG. 1), which includes inter alia an optical module 106.1 according to the disclosure. As still to be explained more specifically below, the optical module 106.1 is designed as a facet mirror. The optical projection device 103 includes a further system of optical elements 107, which includes a plurality of optical modules 107.1. The optical modules of the optical systems 106 and 107 are in this case arranged along a folded optical axis 101.1 of the imaging device 101.

In the example shown, the imaging device 101 operates with light in the EUV range at a wavelength of between 5 nm and 20 nm, to be more specific at a wavelength of approximately 13 nm. Consequently, the optical elements in the illumination device 102 and the projection device 103 are designed exclusively as reflective optical elements. However, it goes without saying that any desired types of optical element (e.g. refractive, reflective or diffractive optical elements) can also be used, either individually or in any desired combination, in other variants of the disclosure that operate at different wavelengths. Furthermore, the projection device 103 may also include a further optical module according to the disclosure, for example in the form of a further facet mirror.

Figure 2:
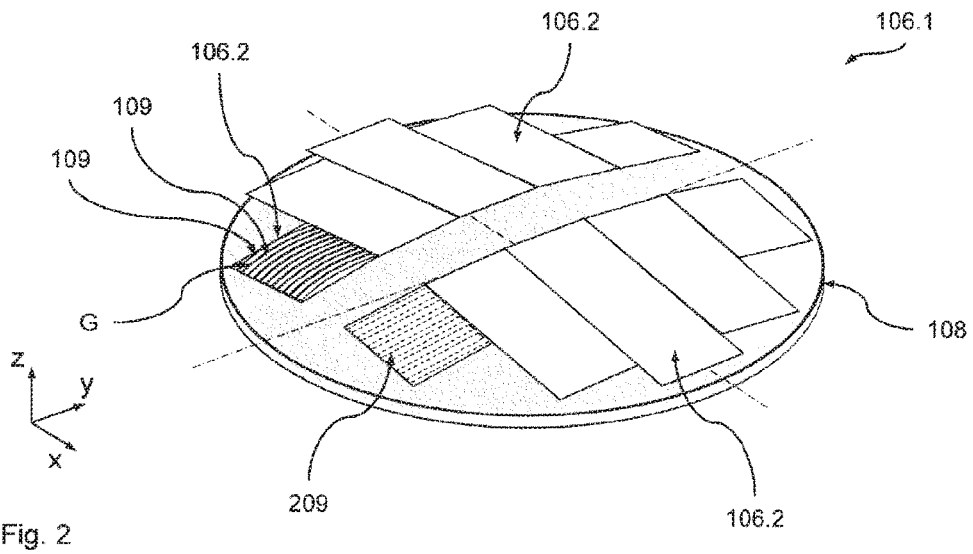
FIG. 2 is a schematic perspective view of the optical module according to the disclosure from FIG. 1.
Figure 3:
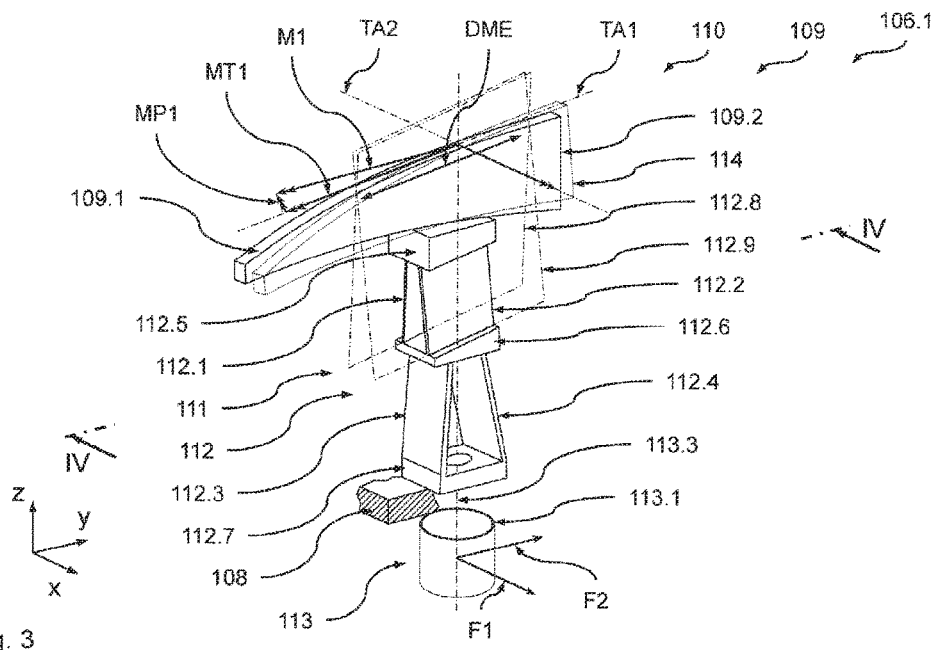
FIG. 3 is a schematic perspective view of the optical unit according to the disclosure from FIG. 2.
Figure 4:
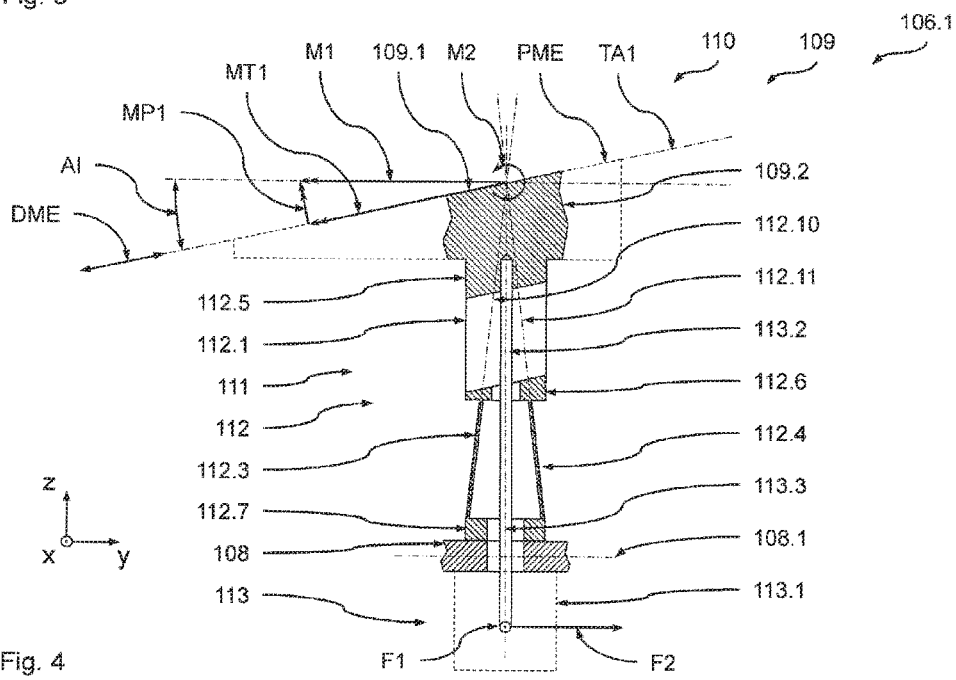
FIG. 4 is a schematic sectional view through part of the optical unit from FIG. 3 (along line IV-IV from FIG. 3).

As can be seen in particular from FIGS. 2 to 5, the facet mirror 106.1 includes a supporting structure in the form of a base structure 108, which supports a multiplicity of optical elements in the form of facet elements 109, which are in each case a component part of an optical unit 110 according to the disclosure (only a single optical element 110 being illustrated in FIGS. 3 and 4). The respective optical unit 110 is designed such that the facet element 109 is actively adjustable for changing the illumination setting, as explained more specifically below.

Furthermore, in the present example the facet elements 109 are divided into ten facet element groups 106.2, the optical surfaces 109.1 of the facet elements 109 of the respective facet element group 106.2 all having a comparable coarse alignment in relation to the plane of main extension of the supporting structure 108 (xy plane). As can be seen from FIG. 2, the facet element groups 106.2 are each different with regard to this coarse alignment.

In FIG. 2, for reasons of overall clarity only eleven facet elements 109 of a facet element group 106.2 are explicitly indicated. It goes without saying, however, that the facet mirror 106.1 may in reality also include significantly more facet elements 109. It also goes without saying that, in the case of other variants of the disclosure, any desired number of (any desired) optical elements may be supported on a corresponding supporting structure.

It should be noted that, in the case of facet devices, it is preferred that as many facet elements 109 as possible are provided, to achieve a homogenization of the light that is as extensive as possible. In particular in the case of facet devices for use in lithography in the EUV range, it is preferred that 100 to 100000, preferably 100 to 10000, more preferably 1000 to 10000, facet elements are provided. In particular in the case of use for inspection purposes, e.g. in mask inspection, however, it may also be that fewer facet elements are used. It is preferred that, for such devices, 50 to 100000, preferably 100 to 7500, more preferably 500 to 5000, facet elements are provided.

In the example shown, the facet elements 109 are arranged in the respective facet element group 106.2 such that between them there remains a narrow gap G of a maximum width of approximately 0.200 mm to 0.300 mm (that is to say approximately 200 µm to 300 µm), in order to achieve the smallest possible loss of radiant power. However, it goes without saying that, in the case of other variants of the disclosure, any other desired arrangement of the optical elements supported by the supporting structure may also be realized, depending on the desired optical properties of the imaging device.

In particular, depending on their design, in particular depending on the type of design of the optically effective surface 109.1, the facet elements 109 may also be set more closely; therefore, the maximum gap G between the facet elements 109 may consequently also be less than 0.2 mm.

As can be seen in particular from FIGS. 2, 3 and 4, the facet element 109 has a reflective, and consequently optically effective, surface 109.1 (which is also referred to below as the optical surface 109.1). The reflective surface 109.1 is formed on a front side of a facet body 109.2 of the facet element 109 that is facing away from the base structure 108 and facing toward the illumination light beam.

The surface area of the optically effective surface 109.1 of the facet element 109 is preferably 0.1 $mm^2$ to 200 $mm^2$, preferably 0.5 $mm^2$ to 100 $mm^2$, more preferably 1.0 $mm^2$ to 50 $mm^2$. In the present example, the surface area of the optically effective surface 109.1 is approximately 70 $mm^2$.

In the example shown, the optically effective surface 109.1 is also configured to be substantially planar. In this case, the optical surface 109.1 has an elongate, slender and generally arcuate outer contour. In the present example, the optical surface 109.1 has a first maximum dimension in the direction of main extension DME, while it has a second maximum dimension perpendicularly to the direction of main extension DME, the second maximum dimension in the present example being approximately 6% of the first maximum dimension. However, it goes without saying that in the case of other variants a different ratio may also be chosen. Particularly favorable setups are obtained if the second maximum dimension is less than 10%, preferably less than 5%, more preferably 0.2% to 2%, more preferably 0.5% to 1%, of the first maximum dimension.

The outer contour of the optical surface 109.1 also defines a direction of main extension DME and a plane of main extension PME, which in the present example in each case run in an inclined manner in relation to the plane of main extension 108.1 of the base structure 108 (the angle of inclination in the present example being approximately 12°). The direction of main extension DME in this case designates that direction in the plane of main extension PME in which the optical surface 109.1 has its maximum dimension. However, it goes without saying that, in the case of other variants, any other desired, at least partly polygonal and/or at least partly curved outer contour may be provided.

As can be seen from FIGS. 3 and 4, apart from the facet element 109, the optical unit 110 includes a supporting device 111, by way of which the facet element 109 is supported on the base structure 108. The supporting device 111 in this case includes a passive supporting unit 112, which is mounted on the base structure 108 and introduces the entire weight of the facet element 109 into this base structure 108, and also an actuator unit 113, which is configured for tilting the facet element 109, and consequently the optical surface 109.1.

For this purpose, the supporting unit 112 includes a series of supporting elements in the form of leaf springs 112.1 to 112.4, which in each case form an elastically deformable portion of the supporting unit 112 and the way in which they function is explained more specifically below. By way of these supporting elements 112.1 to 112.4, the facet body 109.2 is connected to the base structure 108. For this purpose, the facet body 109.2 is first connected to a head element 112.5 of the supporting unit 112. Between the head element 112.5 and an intermediate element 112.6, the two first leaf springs 112.1 and 112.2 are arranged kinematically parallel to one another (in a supporting direction). Between the intermediate element 112.6 and a base element 112.7, the two second leaf springs 112.3 and 112.4 are then arranged kinematically parallel to one another (in the supporting direction). Finally, the base element 112.7 is connected substantially rigidly to the base structure 108 in any desired suitable way.

In the present example, the supporting unit 112 is designed as a monolithic unit of a suitable material. However, it goes without saying that, in the case of other variants of the disclosure, a differential type of construction may be chosen, in which at least part of the supporting unit may also be composed of separate components connected to one another in a suitable way.

The actuator unit 113 includes an (only very schematically illustrated) actuator 113.1 and also a rod-shaped adjusting element 113.2. In the present example, the actuator 113.1 is fastened on the side of the base structure 108 facing away from the facet element 109 such that it can interact with the adjusting element 113.2. The adjusting element 113.2 (which in FIG. 3 is only indicated by its longitudinal axis 113.3) extends through corresponding recesses in the base structure 108 and also in the supporting structure 112 and is connected substantially rigidly to the facet body 109.2.

For tilting the optical surface 109.1, in the present example the actuator 113.1 exerts on the free end of the adjusting element 113.2 a first force F1 (running parallel to the x axis) in a first operating state of the imaging device 101 and a second force F2 (running parallel to the y axis) in a second operating state of the imaging device 101. In the present example, the two forces F1 and F2 are substantially orthogonal to one another and lie in a plane that runs substantially parallel to the plane of main extension 108.1 of the base structure 108.

As can also be seen from FIGS. 3 and 4, the first force F1 produces a first tilting moment M1 by way of the adjusting element 113.2 in the region of the optical surface 109.1, while the second force F2 produces a second tilting moment M2 by way of the adjusting element 113.2 in the region of the optical surface 109.1. The two tilting moments M1 and M2 in this case lie in a plane that runs substantially parallel to the plane of main extension 108.1 of the base structure 108.

While the second tilting moment M2 in this case lies in the plane of main extension PME of the optical surface 109.1, the first tilting moment M1 runs in an inclined manner in relation to the plane of main extension PME of the optical surface 109.1 by an angle of inclination AI, the angle of inclination AI in the present example being AI=12°.

This inclination of the first tilting moment M1 in relation to the plane of main extension PME has the consequence that, when there is tilting of the optical surface 109.1, apart from the tilting component MT1 of the first tilting moment M1 lying in the plane of main extension PME, there is a parasitic component MP1, which is perpendicular to the plane of main extension PME.

In the case of conventional designs of the supporting device, which typically provide a cardanic support with two orthogonal tilting axes that run parallel to the plane of the supporting structure, an undesired parasitic lateral rotation movement of the optical element is produced in the plane of main extension PME, as is indicated in FIG. 3 by the dotted contour 114 (exaggerated for reasons of overall clarity).

In the case of conventional designs, this parasitic lateral rotation movement of the facet element 114 has the effect that the facet elements can only be arranged with correspondingly large interspaces or gaps in relation to one another to be able to realize the desired tilting movements of the optical surface. These large gaps between the facet elements 114 have in turn the consequence that a comparatively large proportion of the illumination light is lost.

In the case of a conventional facet mirror, the facet elements of which are arranged in a way similar to the facet mirror 106.1, gap widths of approximately 450 µm are typically provided. In the case of these conventional designs, the loss of light output (also referred to as transmission loss) is approximately 11%.

In order to reduce this transmission loss, in the present example the supporting unit 112 is configured to predefine a first tilting axis TA1 for the optical surface 109.1 that lies substantially in the plane of main extension PME of the optical surface 109.1 when there is tilting of the optical surface 109.1 by the tilting moment M1 of the actuator unit 113.

The first tilting axis TA1 may in principle be oriented in almost any way desired within the plane of main extension PME. In the present example, however, a particularly dense packing or close-together arrangement of the facet elements 109 is however achieved by the supporting unit 112 defining a first tilting axis TA1 that runs substantially parallel to the direction of main extension DME of the optical surface 109.1. As a result, particularly small parasitic movements of the facet element 109 are advantageously achieved when there is tilting by the first tilting moment M1.

It goes without saying that, depending on the design of the optical surface or of the facet element, when there is tilting, certain parasitic movements that make it desirable to provide corresponding gaps between the facet elements are possibly unavoidable. This applies in particular in the case of facet elements of which the optical surfaces deviate greatly from a straight form, that is to say for example have a pronounced arcuate design. The straighter the form of the optical surface is, the more the parasitic movements can be reduced with the present disclosure. Particularly favorable designs are obtained when the first tilting axis TA1 runs collinear to the direction of main extension DME of the optical surface.

Because of the planar design of the optical surface 109.1, in the present example the first tilting axis TA1 lies substantially on the optical surface 109.1. As a result, particularly small parasitic movements are obtained when there is tilting by the first tilting moment M1.

However, it goes without saying that such a setup cannot be realized in the case of curved optical surfaces; in these cases, to minimize such parasitic movements it is preferably provided that the first tilting axis intersects or forms a tangent to the optical surface at at least one tilting axis point. In the latter case, the first tilting axis for the optical surface then lies in the tangential plane of the optical surface that the latter defines at the tilting axis point. As a result, particularly favorable kinematic conditions with smallest possible parasitic movements are also obtained in such cases.

It also goes without saying that, in the case of other variants, the tilting axis may in principle also run at a certain distance from the optical surface. Although this produces parasitic movements, it may be appropriate, in particular whenever it allows synchronous parasitic movements of adjacent facet elements to be followed, and so a dense packing of the facet elements is possible in spite of the parasitic movements.

In order to define the first tilting axis TA1, in the present example the two first leaf springs 112.1 and 112.2 are designed as thin, substantially planar (under the load resulting from the weight of the facet element 109) spring elements, which are arranged in an inclined manner in relation to one another in such a way that their planes of main extension 112.8 and 112.9 intersect in the first tilting axis TA1, and thereby define the first tilting axis TA1. It should be noted in this context that the fact that two leaf springs that are inclined in relation to one another define such a tilting axis in the line of intersection of their planes of main extension is sufficiently well known, and so is not to be discussed any more specifically at this point.

Apart from the fact that the first tilting axis TA1 is thereby defined, the described arrangement of the first leaf springs 112.1 and 112.2 has the advantage that the first leaf springs 112.1 and 112.2 are primarily subjected to a shear loading in their respective plane of main extension 112.8 or 112.9 by the parasitic component MP1 of the tilting moment M1. Since the two first leaf springs 112.1 and 112.2 of course have a high shear resistance, the pair of leaf springs 112.1, 112.2 can take up the parasitic component MP1 and compensate for it by a corresponding opposing elastic moment without any appreciable deformation of the leaf springs 112.1 and 112.2.

In other words, the leaf springs 112.1 and 112.2 restrict in particular the rotational degree of freedom perpendicularly to the plane of main extension PME of the optical surface 109.1, whereby the compensation for the parasitic component MP1 of the tilting moment M1 is advantageously achieved.

Something comparable also applies to the second pair of leaf springs including the two second leaf springs 112.3 and 112.4, which are likewise primarily subjected to a shear loading in their respective plane of main extension 112.10 or 112.11 by the parasitic component MP1 of the tilting moment M1.

As a result, this design has the effect that, in spite of its inclination in relation to the plane of main extension PME, the tilting moment M1 leads almost exclusively to a tilting of the optical surface 109.1 about the first tilting axis, while parasitic movements caused by the parasitic component MP1 are prevented almost completely by the high shear resistance of the leaf springs 112.1 to 112.4.

In order also to define the second tilting axis TA2, in the present example the two second leaf springs 112.3 and 112.4 are designed in an analogous way as thin, substantially planar spring elements, which are arranged in an inclined manner in relation to one another in such a way that their planes of main extension 112.10 and 112.11 intersect in the second tilting axis TA2, and thereby define the second tilting axis TA2.

In the present example, the second tilting moment M2 lies in the plane of main extension PME of the optical surface 109.1, and so it has no parasitic component perpendicularly to the plane of main extension PME. However, it goes without saying that, in the case of other variants, there may possibly also be an inclination of the second tilting moment M2 in relation to the plane of main extension PME. In these cases, a design analogous to that of the first leaf springs 112.1 and 112.2 may also be chosen in the case of the second leaf springs 112.3 and 112.4, in order to take up and compensate for such a parasitic component MP2 of the second tilting moment M2, and thereby avoid corresponding parasitic movements when there is tilting of the optical surface 109.1 by the second tilting moment M2.

Even under the adverse conditions with regard to the alignment of the tilting moment M1, it is consequently possible in the case of the present example without elaborate modification of the actuator unit 113, in particular of the actuator 113.1, to predefine a tilting axis TA1 for the optical surface 109.1 that lies substantially in the plane of main extension PME of the optical surface 109.1 by simple, purely passive measures in the region of the supporting device 111. It is accordingly advantageously possible even under these circumstances to prevent lateral displacement of parts of the facet element 109 when there is tilting of the optical surface 109.1.

It is accordingly possible hereby to realize a particularly dense packing of the facet elements 109 with little transmission loss in spite of the active adjustability of the optical surfaces 109.1 (for example when changing the illumination setting). In the present example, the transmission loss through the gaps G between the facet elements 109 is approximately 4.5%. Consequently, in comparison with the conventional design described above (with a transmission loss of approximately 11%), a reduction in the transmission loss of the order of approximately 60% can be achieved by the denser packing of the facet elements 109.

The geometry of the supporting elements may in principle be chosen in any desired suitable way to define the respective tilting axis TA1 or TA2 in the desired position. Variants that are advantageous under dynamic aspects are obtained if at least the leaf springs 112.1 to 112.4 are designed as thin elongate spring elements that have a length dimension along their longitudinal axis and a maximum thickness dimension perpendicular to their leaf spring plane of main extension 112.8 to 112.11, the maximum thickness dimension being less than 4%, preferably less than 2%, more preferably 0.2% to 1%, of the length dimension. In the present example, the maximum thickness dimension of the leaf springs 112.1 to 112.4 is in each case approximately 5% of the length dimension.

It should be mentioned at this point that the leaf springs 112.1 to 112.4 may in principle have any desired outer contour, as long as, within the pair of leaf springs, the leaf spring planes of main extension 112.8 to 112.11 intersect in the respective tilting axis TA1 or TA2. In the present example, a configuration that is particularly easy to produce is chosen, in that the two leaf springs 112.1, 112.2 or 112.3, 112.4 (of the respective pair of leaf springs) have a substantially parallelogram-shaped outer contour in their leaf spring plane of main extension, a pair of sides of the outer contour running substantially parallel to the tilting axis.

As can be seen in particular from FIG. 4, in the present case this is, on the one hand, the case with the respective pair including the sides of the leaf springs 112.1 and 112.2, which adjoin the head element 112.5 and the intermediate element 112.6, and with the respective pair including the sides of the leaf springs 112.3 and 112.4, which adjoin other intermediate element 112.6 and the base element 112.7.

In the present example, the angle of inclination of the first tilting moment M1 to the plane of main extension PME is as mentioned AI=12°. However, it goes without saying that the present disclosure can in principle also be used any other desired inclination of the tilting moment M1 in relation to the plane of main extension PME. It should be noted in this respect that the parasitic component MP1 of the tilting moment M1 becomes all the greater the greater the angle of inclination AI is. Particularly favorable results with comparatively small parasitic movements can typically be achieved in cases in which the tilting moment is inclined by 1° to 30°, preferably 5° to 20°, more preferably 8° to 15°, in relation to the plane of main extension and/or the direction of main extension of the optical surface.

In the case of the method according to the disclosure, to support an optical element that is used in the course of an imaging process according to the disclosure in the imaging device 101, first the facet elements 109 are mounted on the base structure 108 in a mounting step, in that the optical units 110 are fastened to the base structure 108 in the configuration described above. In a setting step, the desired tilting of the optical surfaces 109.1 of the facet elements 109 to be adjusted then takes place. The tilting may in this case take place at the same time and/or to the imaging.

It should be noted at this point that, in the case of certain variants of the disclosure, the tilting of the facet elements 109 may be restricted exclusively to a tilting about one of the two tilting axes TA1 or TA1. Consequently, the actuator 113.1 may therefore possibly be designed such that it can produce either the first force F1 or the second force F2. Similarly, it may of course also be provided that it can exclusively produce the first force F1. In the case of some variants, it may of course also be provided that the actuator 113.1 can produce both forces F1 and F2 simultaneously.

An actuating mechanism of a particularly simple construction is obtained when a separate actuator unit is provided for the respective force F1 and F2. These may be simple linear actuators. However, it goes without saying that, in the case of other variants of the disclosure, any other actuators desired may also be used. In particular, actuators that directly produce a corresponding moment may be used.

Second Embodiment

A further preferred embodiment of the optical module 206.1 according to the disclosure with a further preferred embodiment of the optical unit 210 according to the disclosure is described below with reference to FIGS. 1, 2 and 5 to 7. The optical module 206.1 may be used instead of the optical module 106.1 in the imaging device 101 (this is indicated in FIG. 2 by the facet elements 209 illustrated by dashed lines) and corresponds in its basic design and the way in which it functions to the optical module from FIGS. 3 and 4, and so only the differences are to be discussed here. In particular, identical components are provided with identical reference numerals, while similar components are provided with reference numerals increased by the value 100. Unless otherwise stated below, reference is made to the above statements in connection with the first exemplary embodiment with regard to the features, functions and advantages of these components.

A difference from the optical module 106.1 from FIGS. 3 and 4 lies in the design of the facet elements. As can be seen in particular from FIGS. 5 to 7, the facet element 209 has a substantially planar reflective optical surface 209.1, the surface area of which however again is approximately 70 mm². In this case, the optical surface 109.1 has an elongate and substantially rectangular outer contour, which again defines a direction of main extension DME and a plane of main extension PME, which in the present example in each case run in an inclined manner in relation to the plane of main extension 108.1 of the base structure 108 (the angle of inclination also in the present example being approximately 12%). Also in this example, the optical surface has an elongate, slender outer contour, in which the second maximum dimension is in turn approximately 6% of the first maximum dimension.

A further difference in comparison with the optical module 106.1 from FIGS. 3 and 4 is in the design of the supporting device 211, in particular the supporting unit 212. As can be seen from FIGS. 5 to 7, in the present example, in lieu of the two pairs of leaf springs, three supporting elements 212.12 are provided, which are arranged in relation to one another kinematically parallel in the manner of a tripod between the facet body 209.2 of the facet element 209 and a base element 209.7, which is securely mounted on the base structure 108. The supporting unit 212 also has a guiding unit 215 for the definition of the tilting axes TA1 and TA2, the guiding unit being arranged kinematically parallel to the supporting elements 212.12 between the base element 212.7 and the facet element 209.

In the present example, the supporting elements 212.12 are elastically deformable struts, which are formed by simple slender and straight rod springs, which have substantially the same length along their respective strut longitudinal axis 212.13. In the present example, the struts 212.12 are designed such that, in the state in which they are only subjected to the loading of the weight of the facet element 209, they take up approximately 98% of the weight of the facet element 209 and introduce it into the base element 212.7. This makes it possible to achieve designs of a particularly simple construction that also allow easy integration of the passive compensation of the parasitic component of the tilting moment.

The maximum transverse dimension of the slender struts 212.12 in the present example is approximately KLMN % of their length dimension, whereby a lightweight and stiff designs that are advantageous from dynamic aspects is obtained. In the case of other variants of the disclosure, however, a different degree of slenderness may also be provided. Preferably, the maximum transverse dimension is less than 4%, preferably less than 2%, more preferably 0.3% to 1.8%, of the length dimension. This allows particularly advantageous designs from dynamic aspects to be achieved.

It also goes without saying here that the struts 212 may in turn be differently designed in the case of other variants, in particular may have any desired, partly curved and/or partly polygonal shape.

In the present example, the strut longitudinal axes 212.13 of the struts 212.12 are inclined in relation to one another in such a way that they intersect a point RP of the first tilting axis TA1 that lies on the optical surface 209.1. A mounting of the facet element 209 that is designed in the manner of a ball joint is accordingly realized (in a sufficiently well known way) on the base element 212.7, and thereby on the base structure 108, by way of the struts 212.12.

The guiding unit 215, which is arranged kinematically parallel, supplements this ball joint like attachment realized by the struts 212.12, in order to achieve the desired orientation of the tilting axes TA1 and TA2 and the desired compensation for the parasitic component MP1 of the first tilting moment M1, respectively.

For this purpose, the guiding unit 215 has two guiding elements 215.1, which are connected in an articulated manner to the facet element 209 and the base element 212.7 and are arranged, in a transverse direction TD of the facet element 209, on opposite sides of the facet element 209 in order to produce a corresponding opposing moment, which takes up and compensates for the parasitic component MP1 of the tilting moment M1, respectively. The transverse direction TD lies in this case in the plane of main extension PME and runs perpendicularly to the direction of main extension DME.

The connection of the respective guiding element 215.1 to the facet element 209 takes place in each case by way of the free end of a transverse strut 215.2, which is connected substantially rigidly to the facet element 209 and extends in the transverse direction TD. The attachment to the base element 212.7 takes place in each case by way of the free end of a column element 215.3, which is connected substantially rigidly to the base element 212.7 and extends substantially perpendicularly to the plane of main extension 108.1 of the base structure 108 and substantially parallel to the adjusting element 113.2.

In the present example, the guiding elements 215.1 are in each case formed in the manner of a leaf spring. However, it goes without saying that, in the case of other variants of the disclosure, any other desired design of the guiding elements 215.1 may also be provided, as long as the desired opposing moment with respect to the parasitic component MP1 of the tilting moment M1 is applied by way of the guiding elements 215.1. Thus, in the case of other variants, the guiding elements 215.1 may be designed as simple rod elements that are attached in an articulated manner.

The respective guiding element 215.1 in this case defines a first point of articulation 215.4 on the facet element 209 and a second point of articulation 215.5 on the base element 212.7 (to be more precise on the column element 215.3). The connecting line 215.6 between the first point of articulation 215.4 and the second point of articulation 215.5 extends in this case in a plane running perpendicularly to the plane of main extension PME and parallel to the first tilting moment M1. The connecting line 215.6 in this case runs in an inclined manner in relation to the first tilting moment M1 by a first angle of inclination $AI1=9°$, while it runs in an inclined manner in relation to the plane of main extension PME by a second angle of inclination $AI2=3°$, the connecting line 215.6 being inclined in the same sense of rotation as the plane of main extension PME is inclined in relation to the first tilting moment M1.

Furthermore, the first point of articulation 215.4 is at a distance from the point of rotation RP in the transverse direction TD in each case by a point-of-rotation distance RPD, while the first point of articulation 215.4 and the second point of articulation 215.5 are at a distance from one another by a point-of-articulation distance APD.

The compensating effect or the compensating movement that is obtained when there is tilting of the optical surface 209.1 about the first tilting axis TA1 can be set by way of the angle of inclination AI1 or AI2, the point-of-articulation distance APD and also the point-of-rotation distance RPD. In the present example, the setting is performed such that the tilting axis TA1 is collinear with the direction of main extension DME in the plane of main extension PME. It is provided in particular in this respect that the angle of inclination AI1 or AI2 can be set by way of spacing elements 215.7 between the respective column element 215.3 and the base element 212.7.

It goes without saying, however, that in the case of other variants of the disclosure a different alignment of the first tilting axis TA1 may take place, in particular adapted to the geometry and/or the alignment of the facet element 209, in order to minimize the parasitic movements when there is tilting of the optical surface 209.1 or adapt them to a desired shape.

Here, the first angle of inclination is preferably 1° to 30°, preferably 5° to 20°, more preferably 8° to 15°, while at the same time or alternatively the second angle of inclination may be −10° to 10°, preferably −5° to 5°, more preferably 0° to 2°. This allows at least partial compensation for the parasitic component MP1 of the tilting moment M1 to be achieved in each case in a particularly easy way.

In the present example, the guiding unit 215 restricts three degrees of freedom of movement, specifically restricts two translational degrees of freedom (in the x direction and in the y direction) and one rotational degree of freedom (about the z axis), consequently therefore also the rotational degree of freedom perpendicularly to the plane of main extension PME of the optical surface 209.1, in order to compensate for the corresponding parasitic component MP1 of the tilting moment M1.

It goes without saying here that, as mentioned, in the case of certain variants it is possible that the parasitic component MP1 of the tilting moment M1 can only be partly compensated, and therefore it is also possible that a certain parasitic movement is allowed, in order possibly to follow the parasitic movements of other, adjacent facet elements 209. The guiding unit 215 is then preferably designed in such a way that, when there is tilting of the optical surface 209.1 by the tilting moment M1, an opposing moment CM that compensates for at least part, in particular at least 75%, preferably at least 85%, more preferably 90% to 100%, of the parasitic component MP1 of the first tilting moment M1 is exerted on the facet element 209.

Figure 5:
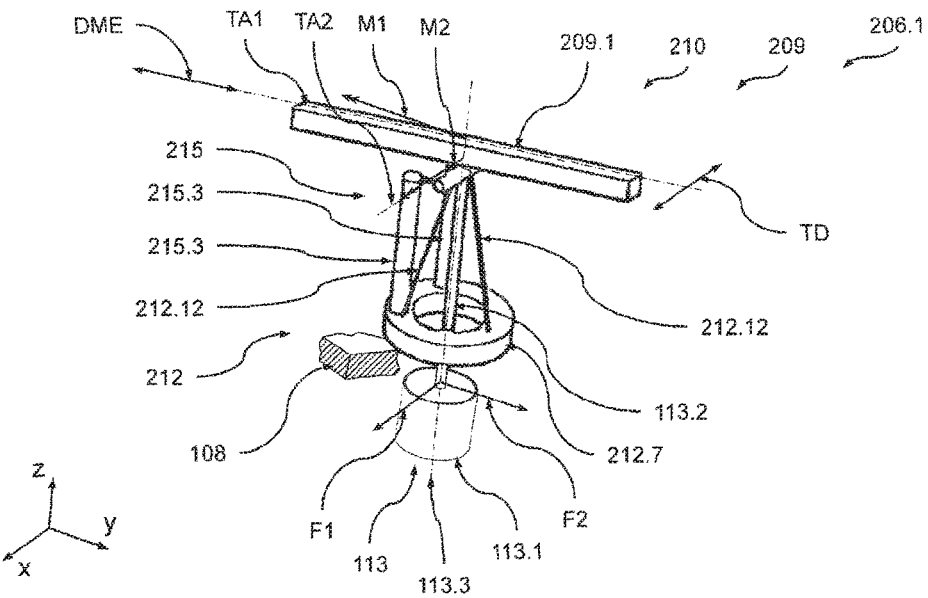
FIG. 5 is a schematic perspective view of a further preferred variant of the optical unit according to the disclosure.
Figure 6:
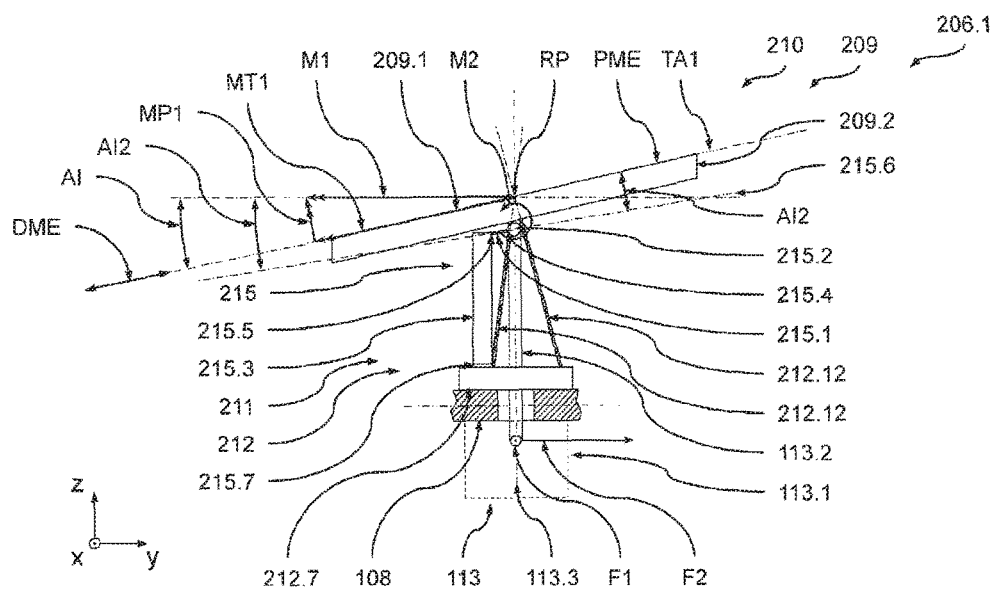
FIG. 6 is a schematic side view of the optical unit from FIG. 5.

As can also be seen from FIGS. 5 to 7, the second force F2 in turn produces a second tilting moment M2 by way of the adjusting element 113.2 in the region of the optical surface 109.1, the second moment M2 or the second tilting axis TA2 running substantially parallel to the plane of main extension PME as result of the attachment by way of the guiding unit 215, but lying between the point of rotation RP and the axis defined by the two first points of articulation 215.4. This results in the struts 212.12 being subjected to particular loads, and so it is preferred that the present example is used for applications in which the tilting takes place at least predominantly, with preference exclusively, about the first tilting axis TA1.

Third Embodiment

A further preferred embodiment of the optical module 306.1 according to the disclosure with a further preferred embodiment of the optical unit 310 according to the disclosure is described below with reference to FIGS. 1, 2, 6 and 9. The optical module 306.1 may be used instead of the optical module 106.1 in the imaging device 101 and corresponds in its basic design and the way in which it functions to the optical module from FIGS. 5 to 7, and so only the differences are to be discussed here. In particular, identical components are provided with identical reference numerals, while similar components are provided with reference numerals increased by the value 100. Unless otherwise stated below, reference is made to the above statements in connection with the first and second exemplary embodiments with regard to the features, functions and advantages of these components.

The only difference in comparison with the optical module 206.1 from FIGS. 5 to 7 is in the guiding unit 315. As can be seen from FIGS. 8 and 9, instead of the two column elements, a single, substantially plate-shaped column element 315.3, which is articulated on the base element 212.7 by way of a flexure 315.8 designed as a hinge joint, is provided in the case of the guiding unit 315.

This achieves the effect that, for the definition of the tilting axes TA1 and TA2, in the present example the guiding unit 315 restricts only two degrees of freedom of movement, specifically one translational degree of freedom (in the x direction) and one rotational degree of freedom (about the z axis), consequently therefore also the rotational degree of freedom perpendicularly to the plane of main extension PME of the optical surface 209.1, in order to compensate for the corresponding parasitic component MP1 of the tilting moment M1.

As can be seen from FIGS. 8 and 9, besides that, this also achieves the effect that the second force F2 produces a second tilting moment M2 by way of the adjusting element 113.2 in the region of the optical surface 109.1, the second tilting moment M2 or the second tilting axis TA2 then running substantially in the plane of main extension PME, to be precise through the point of rotation RP, as a result of this attachment by way of the guiding unit 315, and so parasitic movements are also excluded to a great extent when there is tilting by way of the second tilting moment M2.

The present disclosure was described above exclusively on the basis of facet mirrors. However, it goes without saying that the disclosure can also be used in connection with any other desired optical modules or optical elements.

The present disclosure was also described above exclusively on the basis of examples from the area of microlithography. However, it goes without saying that the disclosure can also be used in connection with any other desired optical applications, in particular imaging methods at other wavelengths.

The disclosure can thus be used in connection with the inspection of objects, such as for example so-called mask inspection, in which the masks used for microlithography are inspected for their integrity, etc. In FIG. 1, a sensor unit, which senses the imaging of the projection pattern of the mask 104.1 (for further processing), then takes the place of the substrate 105.1. This mask inspection may then take place both substantially at the same wavelength as is used in the later microlithographic process. However, it is likewise possible also to use any desired wavelengths deviating therefrom for the inspection.

Finally, the present disclosure was described above on the basis of specific exemplary embodiments, which show specific combinations of the features defined in the following patent claims. It is explicitly noted at this point that the subject matter of the present disclosure is not restricted to these combinations of features but that the subject matter of the present disclosure also includes all other combinations of features, as they become apparent from the subsequent patent claims.

What is claimed is:

1. An optical unit, comprising:
   an optical element having optical surface defining a plane of main extension and a direction of main extension in the plane of main extension; and
   a supporting device comprising a supporting unit and an actuator unit,
   wherein:
   the actuator unit is configured to exert a first tilting moment on the optical element to tilt the optical surface;
   the first tilting moment is inclined relative to the plane of main extension; and
   the supporting unit predefines a first tilting axis for the optical surface;
   the first tilting axis lies substantially in the plane of main extension of the optical surface when the optical surface is tilted via the first tilting moment, and
   wherein at least one of the following holds:
   the supporting unit comprises at least two at least partly elastically deformable supporting elements which define the first tilting axis;
   the supporting unit comprises at least two supporting elements and a base element, at least a large part of the weight of the optical element being introduced into the base element via the supporting elements in at least one operating state;
   the supporting unit comprises at least one guiding unit connected to the optical element which, to define the first tilting axis, restricts at least two degrees of freedom of movement of the optical element; and
   the supporting unit comprises at least one guiding unit connected to the optical element which, to define the first tilting axis, is configured to take up a component of the first tilting moment acting perpendicularly to the plane of main extension of the optical surface.

2. The optical unit of claim 1, wherein the optical surface is elongate.

3. The optical unit of claim 1, wherein at least one of the following holds:
   the supporting unit is configured so that the first tilting axis of the optical surface runs substantially parallel to the direction of main extension;
   the first tilting moment is inclined by 1° to 30° relative to the plane of main extension
   the tilting first moment is inclined by 1° to 30° relative to the direction of main extension of the optical surface; and
   at at least one tilting axis points, the first tilting axis of the optical surface lies substantially on the optical surface.

4. The optical unit of claim 1, wherein the supporting unit is a passive device which defines the first tilting axis via passive elements.

5. The optical unit of claim 1, wherein:
the supporting unit comprises at least two elastically deformable supporting elements configured as a leaf spring defining the first tilting axis; and
at least one of the following holds:
each of the supporting elements defines a leaf spring plane of main extension and the supporting elements are arranged inclined relative to each other so that the leaf spring planes of main extension intersect in the first tilting axis;
at least one of the supporting elements is a leaf spring configured to be substantially planar in a state in which it is only subjected to the loading of the weight of the optical element;
at least one of the supporting elements is a thin leaf spring with a length dimension along a longitudinal axis and a maximum thickness dimension perpendicular to a leaf spring plane of main extension, the maximum thickness dimension being less than 4% of the length dimension;
each of the supporting elements defines a leaf spring plane of main extension, at least one of the supporting elements having in its leaf spring plane of main extension a substantially parallelogram-shaped outer contour, and at least one pair of sides of the outer contour running substantially parallel to the first tilting axis.

6. The optical unit of claim 1, wherein:
the supporting unit comprises at least three elastically deformable supporting elements configured an elastic strut defining the first tilting axis; and
at least one of the following holds:
the supporting elements are arranged as a tripod;
each supporting elements defines a strut longitudinal axis and the supporting elements are inclined relative to each other so that the strut longitudinal axes intersect at a point of the first tilting axis;
each supporting element defines a strut longitudinal axis and each of the supporting elements has substantially the same length dimension along its strut longitudinal axis;
at least one of the supporting elements is a rod spring configured to be substantially straight in a state in which it is only subjected to the loading of the weight of the optical element; and
at least one of the supporting elements is a rod spring with a length dimension along a longitudinal axis and a maximum transverse dimension perpendicular to the longitudinal axis, the maximum transverse dimension being less than 2% of the length dimension.

7. The optical unit of claim 6, wherein:
the supporting unit comprises a base element and at least one guiding unit to define the first tilting axis;
the supporting elements are supported on the base element;
the guiding unit is kinematically parallel to the supporting elements between the base element and the optical element.

8. The optical unit of claim 7, wherein at least one of the following holds:
the guiding unit comprises at least one guiding element connected in an articulated manner to the optical element and the base element; and
the guiding unit comprises at least one guiding element that is a leaf spring.

9. The optical unit of claim 8, wherein:
at least one guiding element defines a first point of articulation on the optical element and a second point of articulation on the base element; and
a connecting line between the first and second points of articulation is in a plane perpendicular to the plane of main extension and parallel to the first tilting moment, the connecting line being inclined relative to the first tilting moment.

10. The optical unit of claim 9, wherein:
the supporting elements define a point of rotation;
the first point of articulation is a distance from the point of rotation by a point-of-rotation distance;
a point-of-articulation distance is between the first point of articulation and: a) the second point of articulation; b) the point-of-rotation distance; c) the first angle of inclination; and/or d) the second angle of inclination; and
the point-of-articulation distance is configured so that, when the optical surface tilts via the first tilting moment of the actuator unit, the first tilting axis of the optical element is predefined.

11. The optical unit of claim 1, wherein:
the supporting unit is configured to define a second tilting axis of the optical surface;
the second tilting axis runs transverse to the first tilting axis under the effect of a second tilting moment which runs transverse to the first tilting moment; and
the second tilting axis lies substantially in the plane of main extension of the optical surface.

12. The optical unit of claim 11, wherein at least one of the following holds:
the supporting unit is a passive device defining the second tilting axis via passive elements;
the supporting unit comprises at least two at least partly elastically deformable supporting elements defining the second tilting axis;
the supporting unit comprises at least one guiding unit which is connected to the optical element and which, to define the second tilting axis, restricts at least two degrees of freedom of movement of the optical element; and
the supporting unit comprises at least two elastically deformable supporting elements configured as a leaf spring defining the second tilting axis.

13. The optical unit of claim 1, wherein at least one of the following holds:
the optical surface is designed is elongate in the direction of main extension;
the optical surface is slender transverse to the direction of main extension; and
the optical surface has a first maximum dimension in the direction of main extension, the optical surface has a second maximum dimension perpendicular to the direction of main extension, and the second maximum dimension is less than 10% of the first maximum dimension.

14. The optical unit of claim 1, wherein at least one of the following holds:
the actuator unit is configured to exert the first tilting moment on the optical element exclusively in one operating state; and the actuator unit is configured to exert a second tilting moment on the optical element exclusively in one operating state, the second tilting moment running transverse to the first tilting moment.

15. A mirror, comprising:
an optical unit according to claim 1,
wherein the mirror is a facet mirror comprising a plurality of facets, and the optical element is a facet of the facet mirror.

16. An optical imaging device, comprising:
an illumination device comprising a first optical element group; and
a projection device comprising a second optical element group,
wherein:
the illumination device is configured to illuminate an object in an object plane of the projection device;
the projection device is configured to project an image of the object onto an image plane of the projection device; and
the illumination device comprises a facet mirror comprising an optical unit according to claim 1.

17. The optical imaging device of claim 16, wherein the projection device comprises a facet mirror comprising an optical unit according to claim 1.

18. An optical imaging device, comprising:
an illumination device comprising a first optical element group; and
a projection device comprising a second optical element group,
wherein:
the illumination device is configured to illuminate an object in an object plane of the projection device;
the projection device is configured to project an image of the object onto an image plane of the projection device; and
the projection device comprises a facet mirror comprising an optical unit according to claim 1.

19. A method of supporting an optical element via a supporting device, the optical element having an optical surface defining a plane of main extension and a direction of main extension in the plane of main extension, the method comprising:
exerting a tilting moment on the optical element to tilt the optical element so that a tilting axis of the optical element lies substantially in the plane of main extension of the optical surface,
wherein the tilting moment is inclined relative to the plane of main extension, and a supporting unit of the supporting device predefines the tilting axis of the optical surface, and at least one of the following holds:
the supporting unit comprises at least two at least partly elastically deformable supporting elements which define the first tilting axis;
the supporting unit comprises at least two supporting elements and a base element, at least a large part of the weight of the optical element being introduced into the base element via the supporting elements in at least one operating state;
the supporting unit comprises at least one guiding unit connected to the optical element which, to define the first tilting axis, restricts at least two degrees of freedom of movement of the optical element and
the supporting unit comprises at least one guiding unit connected to the optical element which, to define the first tilting axis, is configured to take up a component of the first tilting moment acting perpendicularly to the plane of main extension of the optical surface.

20. A method of using an optical imaging device comprising an illumination device and a projection device, the illumination device comprising a first optical element group, the projection device comprising a second optical element group, the method comprising:
using the illumination device to illuminate a mask in an object plane of the projection device; and
using the projection device to project an image of the mask object onto an image plane of the projection device,
wherein at least one device selected from the illumination device and projection device comprises an optical unit according to claim 1.

21. The optical unit of claim 1, wherein the supporting unit comprises at least two at least partly elastically deformable supporting elements which define the first tilting axis.

22. The optical unit of claim 1, wherein the supporting unit comprises at least two supporting elements and a base element, at least a large part of the weight of the optical element being introduced into the base element via the supporting elements in at least one operating state.

23. The optical unit of claim 1, wherein the supporting unit comprises at least one guiding unit connected to the optical element which, to define the first tilting axis, restricts at least two degrees of freedom of movement of the optical element.

24. The optical unit of claim 1, wherein the supporting unit comprises at least one guiding unit connected to the optical element which, to define the first tilting axis, is configured to take up a component of the first tilting moment acting perpendicularly to the plane of main extension of the optical surface.

25. The method of claim 19, wherein the supporting unit comprises at least two at least partly elastically deformable supporting elements which define the first tilting axis.

26. The method of claim 19, wherein the supporting unit comprises at least two supporting elements and a base element, at least a large part of the weight of the optical element being introduced into the base element via the supporting elements in at least one operating state.

27. The method of claim 19, wherein the supporting unit comprises at least one guiding unit connected to the optical element which, to define the first tilting axis, restricts at least two degrees of freedom of movement of the optical element.

28. The method of claim 19, wherein the supporting unit comprises at least one guiding unit connected to the optical element which, to define the first tilting axis, is configured to take up a component of the first tilting moment acting perpendicularly to the plane of main extension of the optical surface.

* * * * *

UNITED STATES PATENT AND TRADEMARK OFFICE
CERTIFICATE OF CORRECTION

PATENT NO. : 10,215,953 B2
APPLICATION NO. : 15/414193
DATED : February 26, 2019
INVENTOR(S) : Boaz Pnini-Mittler Page 1 of 1

It is certified that error appears in the above-identified patent and that said Letters Patent is hereby corrected as shown below:

In the Claims

Column 22, Line 63, in Claim 3, delete "tilting first" and insert -- first tilting --.

Column 24, Line 52, in Claim 13, delete "is designed is" and insert -- is --.

Column 26, Line 4, in Claim 19, delete "element" and insert -- element; --.

Signed and Sealed this
Thirtieth Day of July, 2019

Andrei Iancu
*Director of the United States Patent and Trademark Office*